United States Patent [19]

Ludden et al.

[11] Patent Number: 5,254,811
[45] Date of Patent: Oct. 19, 1993

[54] HYBRID MICROCHIP BONDING ARTICLE

[75] Inventors: Michael J. Ludden, Swindon, England; Peter Nyholm, Austin, Tex.

[73] Assignee: Raychem Limited, United Kingdom

[21] Appl. No.: 671,789

[22] PCT Filed: Sep. 29, 1989

[86] PCT No.: PCT/GB89/01158
§ 371 Date: May 16, 1991
§ 102(e) Date: May 16, 1991

[87] PCT Pub. No.: WO90/03662
PCT Pub. Date: Apr. 5, 1990

[30] Foreign Application Priority Data

Sep. 30, 1988 [GB] United Kingdom ............ 8823057
Dec. 2, 1988 [GB] United Kingdom ............ 8828245

[51] Int. Cl.$^5$ ............................................. H05K 1/00
[52] U.S. Cl. ........................ 174/268; 361/398; 361/751
[58] Field of Search ............ 174/250, 268; 361/398, 361/402, 404, 414

[56] References Cited

U.S. PATENT DOCUMENTS

| | | | |
|---|---|---|---|
| 4,169,642 | 10/1979 | Mouissie ............... | 361/398 X |
| 4,177,519 | 12/1979 | Kasubuchi et al. ......... | 174/268 X |
| 4,371,744 | 2/1983 | Badet et al. ............ | 361/414 X |
| 4,540,226 | 9/1985 | Thompson et al. ......... | 361/414 X |
| 4,835,846 | 6/1989 | Juan et al. ............. | 361/398 X |
| 4,949,158 | 8/1990 | Ueda .................. | 361/398 X |

Primary Examiner—Leo P. Picard
Assistant Examiner—Trinidad Korka
Attorney, Agent, or Firm—Sheri M. Novack; Herbert G. Burkard

[57] ABSTRACT

An article for tape-automated bonding of integrated circuit microchips comprises a carrier sheet (22) carrying conductive tracks (23) with a tubular metal formation (21) passing through the sheet at the end of each track for connection to a microchip (24). The tubular formations tend to accommodate irregularities in the chip and may contain solder or other metal having a lower melting point than the tubular formation to effect bonding.

7 Claims, 5 Drawing Sheets

PRIOR ART

HYBRID MICROCHIP BONDING ARTICLE

FIELD OF INVENTION

This invention relates to a hybrid bonding article which can be provided in arrangements suitable for use in tape-automated bonding (TAB) of semiconductor microcircuits (microchips).

INTRODUCTION TO INVENTION

Known TAB devices have a structure akin to that shown schematically in the accompanying sketch A. A polymer tape A1 having edge sprocket holes A2 for feeding the tape in automated bonding equipment carries a series of arrays (one shown) of conductive tracks A3 arranged in a pattern suitable for bonding their inner ends A4 to the bonding sites of a microchip (not shown). The tape A1 is cut away under the ends A4 of the tracks so that the ends project as unsupported "flangers" over the cut-away space A5. Bonding is effected by bending the flangers into the space A5 to make contact with the chip positioned against the opposite side of the tape from that carrying the tracks. This is followed by bonding by known techniques which often require the chip bonding sites to "bumped" with bonding material, e.g. solder.

The present invention can avoid such disadvantageous "bumping" processes.

Another form of TAB device known as "area TAB" is described in U.S. Pat. Nos. 3,832,769, 3,868,724 and 4,472,876, in which the conductive tracks do not project as "fingers", but instead are connected to solid metal terminals formed in holes passing through the tape material. The terminals project from the surface of the tape remote from the tracks and can therefore make electrical contact with bonding sites on micro chips or other devices brought into contact therewith. The reliability of the electrical contacts thus established may be limited by the relative rigidity of the terminals hindering their ability to conform to variations in height of the bonding sites on the chip, especially as increasing miniaturization and complexity of microchips requires bonding sites in central areas of the chip as well as around its edges.

SUMMARY OF THE INVENTION

The present invention alleviates these problems by means of an ingenious hybrid form of TAB article, and accordingly provides in one of its aspects a tape-automated bonding article comprising a carrier sheet carrying at least one array of electrically conductive tracks having ends arranged for bonding to a microcircuit device, each such bondable track end being supported by the carrier sheet material and being electrically connected to a surface region of the carrier material not carrying that track end by a tubular formation of electrically conductive material within, preferably plated within, at least one connecting hole of diameter less than 200 micrometers, preferably less than 100 micrometers, more preferably less than 50 micrometers. The holes will usually pass more or less straight through the sheet to its opposite surface (i.e., the "surface region not carrying the track end"), but may be sloping or indirect (e.g. curved) if desired. Preferably, the tubular conductive material in the connecting hole or holes projects beyond the said surface region so as to facilitate bonding to the microcircuit, and this may be achieved by removing one or more layers from the carrier sheet after plating (or other provision) of the conductive material in the connecting hole.

The use of a tubular formation of conductive material (preferably metal) in the connecting holes has considerable advantages over the known solid metal terminals. The tubes may crumple when compressed longitudinally against a microchip or other device, thus taking up irregularities without the major deviation from the longitudinal axis which normally results when solid columns or wires are so compressed. Also, solder or other fusible material may be provided at or within the ends (at least) of the tubes to facilitate thermal bonding and electrical connection.

This hybrid TAB article according to the invention may be constructed with cut-away "fingers" of the carrier sheet material supporting the conductive track ends to be bonded, thus providing a "fingered" construction corresponding to, but with advantages over, the ordinary TAB article; or may be constructed with "fingers" extending also to the central regions of the chip. These "fingered" hybrids may be regarded as a separate aspect of the invention, for which alternative forms of connection (e.g. solid wires or posts) may also be useful. Cutting away the carrier is not essential, since the tubular projections from the connecting holes can be arranged to render unnecessary the bending of the track ends, but the "fingered" construction may provide advantageous flexibility in articles with central, as well as peripheral, connection sites.

DETAILED DESCRIPTION OF INVENTION

Figure 1:
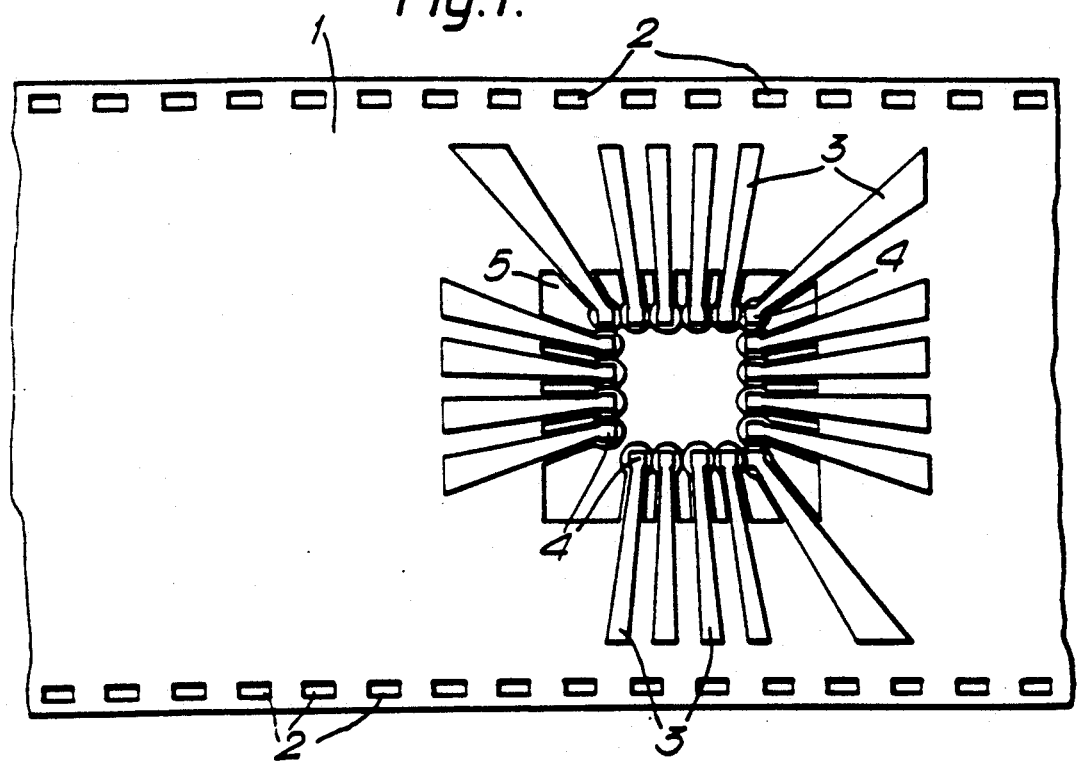
FIG. 1 shows in plan view a tape-automated bonding (tab) article according to the present invention.
Figure 8:
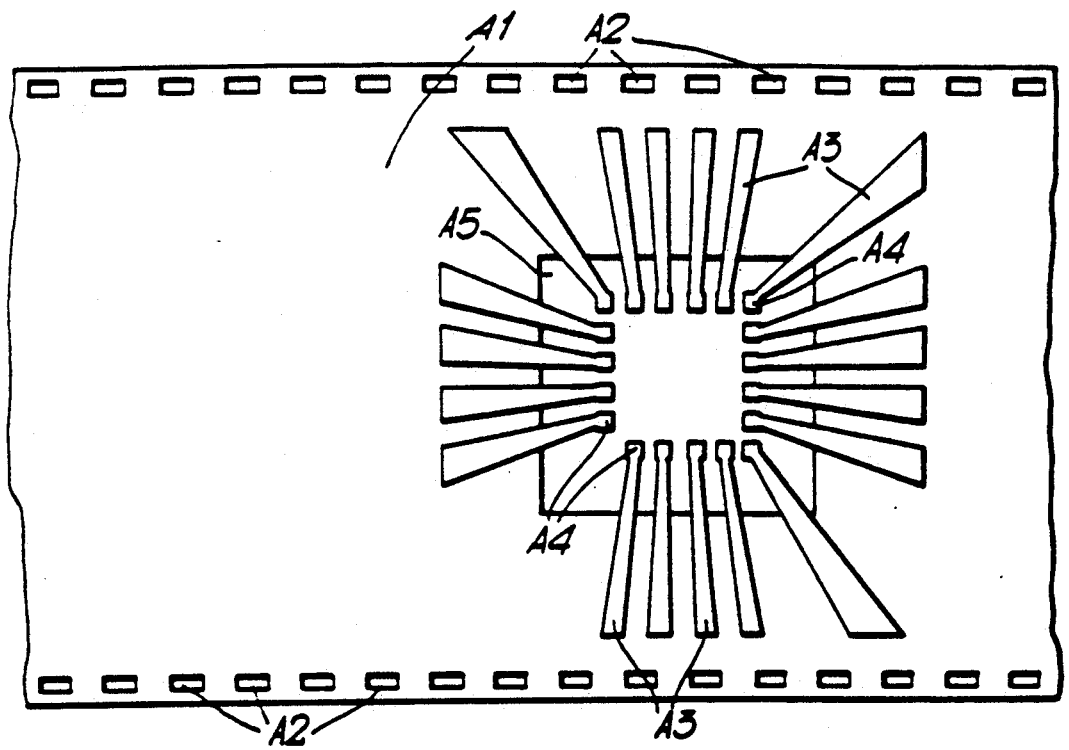
FIG. 8 shows a plan view of a prior art tape-automated bonding (tab) article.

An example of a fingered construction accordingly to the present invention is illustrated schematically in FIG. 1 of the accompanying drawings, wherein the reference numerals correspond to the numerals used in FIG. 8.

The connecting holes with the tubular electrically conductive material, preferably metal, therein, one or more per track end, cannot be made by the methods described in the known "area TAB" patents mentioned above. The present invention preferably hybridizes the TAB concept with methods and materials for making self-supporting uniaxial connectors described in any one or more of copending British Patent Applications 8802567, 8802565, 8802566, 8802568, 8815447.1, and European Published Patent Applications EP-A-0213774, 0327399, 0329314 and 0327398, the disclosures of all of which are incorporated herein by reference. Laser ablation drilling of a layered polymer sheet and metal plating within the hole(s) followed by removal of one or more soluble layers from the sheet (to expose the ends of the metal tubes thus formed within the holes) is preferred. The resulting hybrid TAB article incorporating in situ tubular uniaxial connectors, with the metal TAB tracks preferably subsequentially applied to its surface, represents a significant commercial advance, as aforesaid, over previously proposed TAB articles.

These and other aspects of the invention are illustrated in the largely self-explanatory FIGS. 2 to 7 of the accompanying drawings, and the invention includes any novel sub-set or sub-combination of the features disclosed in the drawings or description of this specification.

Figure 2:
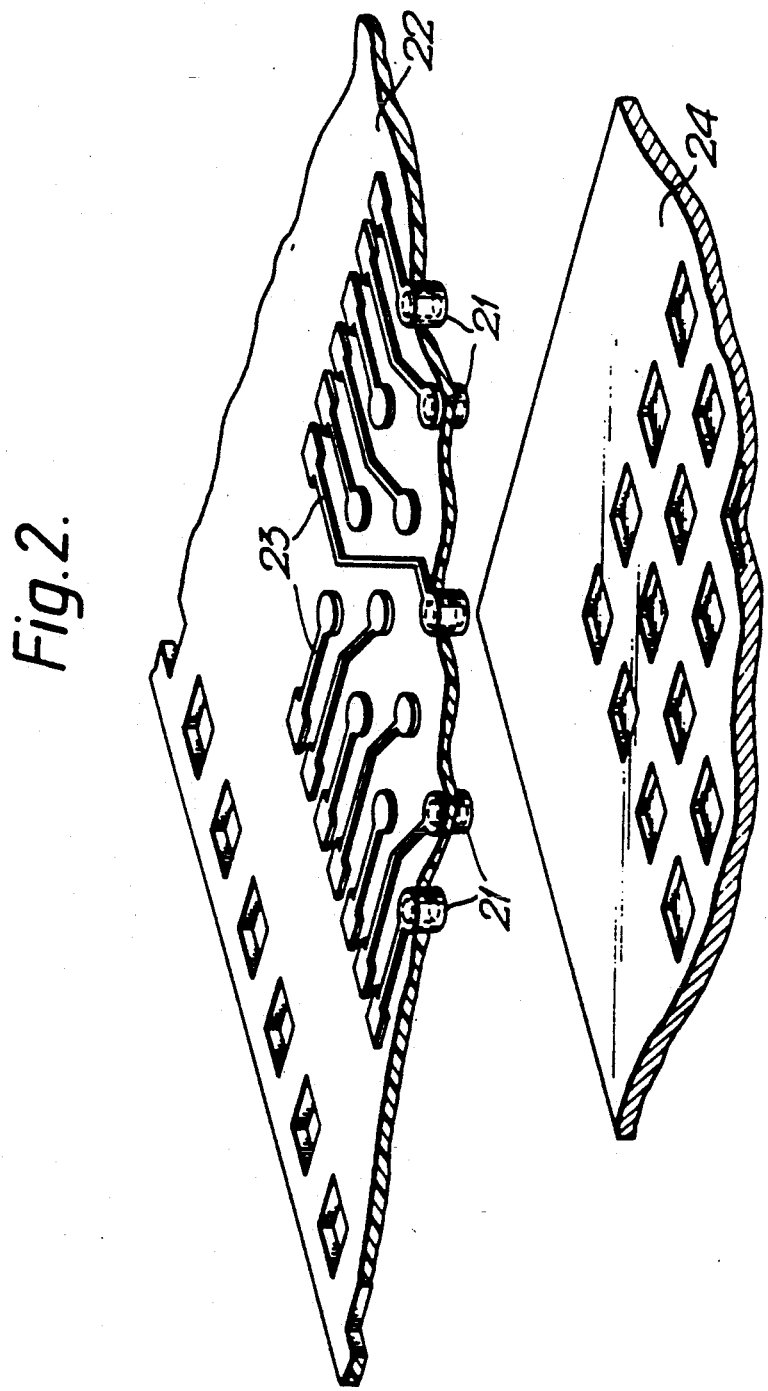
FIG. 2 shows a form of tab article not having the cut-away fingers of the present invention.

FIG. 2 illustrates schematically the use of a TAB article according to the invention with central connection sites but without the easily envisaged cut-away "fingers". Metal tubes 21 project from holes through a polyimide sheet 22, with conductive tracks 23 connecting to the tubes. A standard unbumped I.C. is shown in position for thermocompression (or other) bonding to the hybrid TAB article.

Figure 3:
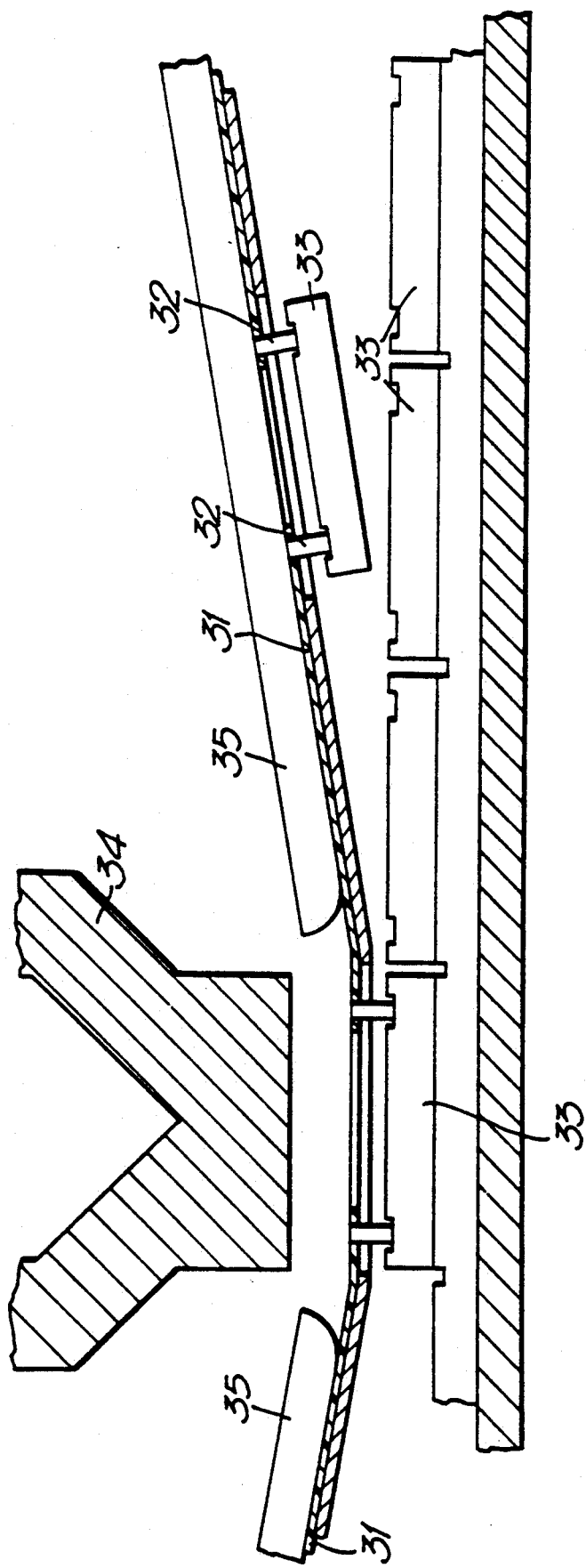
FIG. 3 shows schematically a tab production line.

FIG. 3 illustrates schematically a TAB production line in which a polyimide tape article 31 according to the invention with projecting plated metal tubes 32 is assembled with unbumped integrated circuit chips 33. The tape 31 is fed from left to right (as shown) by means not shown, passing under guides 35, and is bonded to the chips 33, feeding from right to left, by thermode 34.

Figure 4:
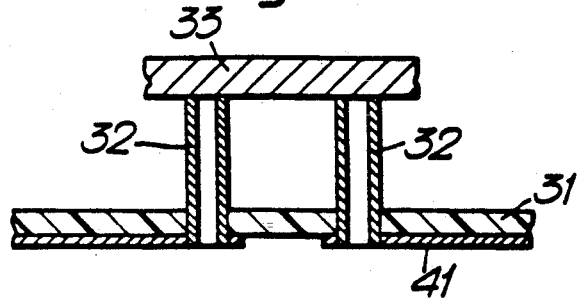
FIG. 4 shows schematically in enlarged detail part of FIG. 3.

FIG. 4 shows in more detail part of the TAB article and chip of FIG. 3 (inverted), with metal tracks 41 on the surface of tape 31.

Figure 5:
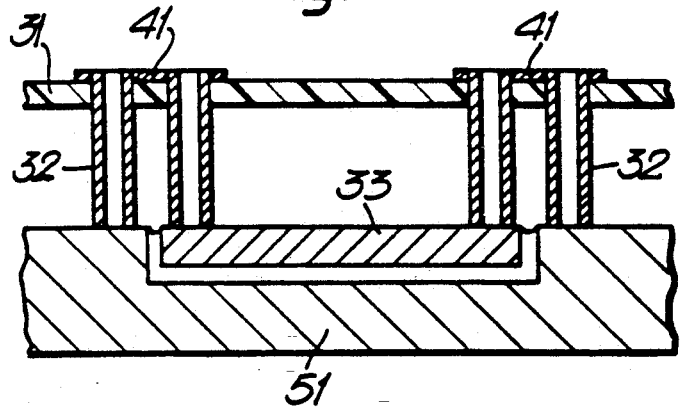
FIG. 5 shows schematically in enlarged detail a tab article in use with a microchip embedded in a support substrate.

FIG. 5 shows a TAB article with a chip 33 inset in a support substrate 51, the metal tubes 32 in this case electrically bridging, via the tracks 41, between the chip 33 and the substrate 51.

Figure 6:
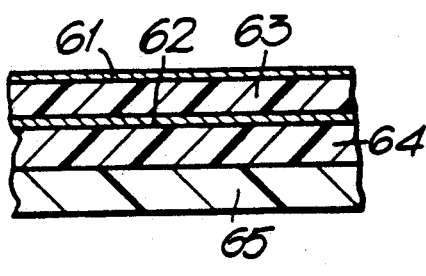
FIG. 6 shows schematically a laminar sheet for making a multi-level tab article.

FIG. 6 shows a multilayer polymer/metal laminate suitable for making a multi-level TAB article (see FIG. 7) according to the invention. Copper track-forming layers 61 and 62 are provided on the opposite faces of polyimide sheet 53, with an optional further layer 64 of polyimide and a soluble layer 65 (e.g. of polyamide). The polyimide and soluble polymer layers may be those described in the aforementioned British applications and published European applications.

Figure 7:
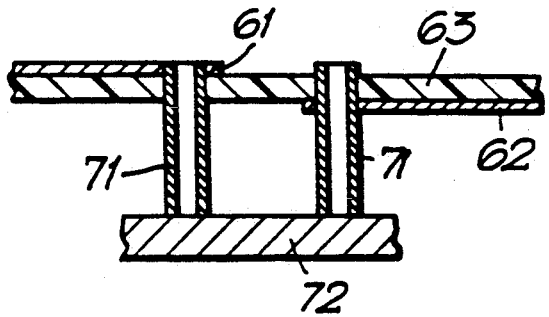
FIG. 7 shows schematically an article made from the laminate of FIG. 6 in use with a microchip.

FIG. 7 shows the use of a multi-level hybrid TAB article made by drilling and plating the laminate of FIG. 6, (optional layer 64 omitted) followed by removal of the soluble polymer layer 65. Such a structure permits closer spacing of the metal tubes 71 to connect to high density I.C. 72 (standard unbumped form).

The hybrid TAB articles according to the present invention can advantageously be impedance matched with the other circuitry to be connected. Multi-layer articles (e.g. FIG. 7) could advantageously separate signals from power, and very fine separation (pitch) between tracks may be achieved.

When the sheet which ultimately contains the conductive through-holes (as distinct from any removable surface layers on such a sheet) is to comprise a polyimide material, a preferred polymer material is a substantially fully cyclised polyimide capable of retaining at least 50%, preferably at least 75%, more preferably at least 85%, of its original elongation after immersion in water of pH10 at 100° C. for 4 days according to ASTM D882. It will be readily understood that a "substantially fully cyclised" polyimide is one having substantially no open imide rings or uncyclised amic acid groupings. Such a polyimide is better able to survive hot alkaline metal plating baths, which attack incompletely cyclised polyimides such as Kapton (TM).

The currently preferred commercially available polyimides are those available under the Trade Mark "UPILEX" from Ube/ICI. One of these, "UPILEX R", is believed to be a relatively completely cyclised polymer having a repeat unit derived from biphenyl dianhydride and diaminodiphenylether, viz.

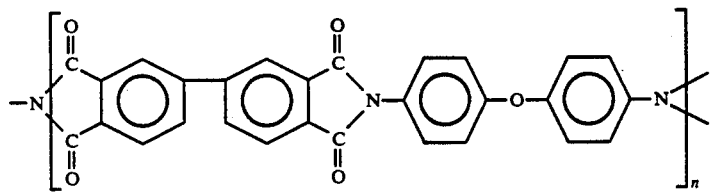

Preferred, however, is "UPILEX S", which is believed to have a repeat unit derived from the same anhydride and phenylene diamine, viz.

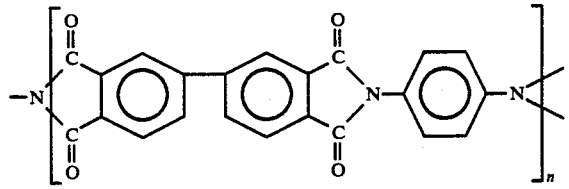

We claim:
1. A tape-automated bonding article comprising a carrier sheet having first and second main surfaces, the first surface carrying at least one array of electrically conductive tracks having ends arranged for bonding to a microcircuit device, each such track end being electrically connected to the second surface of the carrier sheet by a tubular formation of electrically conductive material within at least one connecting hole of a diameter less than 200 micrometers, which tubular formation is bondable to the microcircuit device in use to connect the track end electrically thereto.

2. An article according to claim 1, wherein the tubular conductive sheet in the connecting hole or holes projects beyond the said surface region so as to facilitate bonding to the microcircuit.

3. An article according to claim 1 having conductive tracks on more than one level within its laminar structure.

4. An article according to claim 1, having at or within that end of at least some of the tubular formations which is to be bonded to the microcircuit in use fusible electrically conductive bonding material which can be fused to effect bonding at a fusion temperature lower than that of the tubular material.

5. An article according to claim 2, wherein the fusible material is a solder or similar low-melting-point metal alloy.

6. An article according to claim 1, wherein the carrier sheet comprises a substantially fully cyclised polyimide capable of retaining at least 50% of its original elongation after immersion in water of pH10 at 100° C. for 4 days according to ASTM D882.

7. An article according to claim 1, wherein the at least one connecting hole is formed by laser ablation drilling and wherein at least one layer of at least one metal is plated on the interior surface of the holes.

* * * * *

UNITED STATES PATENT AND TRADEMARK OFFICE
CERTIFICATE OF CORRECTION

PATENT NO. : 5,254,811

INVENTOR(S) : Ludden et al.

DATED : October 19, 1993

It is certified that error appears in the above-identified patent and that said Letters Patent is hereby corrected as shown below:

```
Column, 1, line 21, replace "flangers" by --fingers--.

Column 1, line 22, replace "flangers" by --fingers--.

Column 3, line 50, replace "53" by --63--.
```

Signed and Sealed this

Fourteenth Day of June, 1994

Attest:

BRUCE LEHMAN

*Attesting Officer*  *Commissioner of Patents and Trademarks*